United States Patent
Kwak et al.

(10) Patent No.: US 7,638,796 B2
(45) Date of Patent: Dec. 29, 2009

(54) ORGANIC LIGHT-EMITTING DISPLAY DEVICE

(75) Inventors: Moh Min Kwak, Yongin (KR); Tae Min Kang, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 293 days.

(21) Appl. No.: 11/580,797

(22) Filed: Oct. 13, 2006

(65) Prior Publication Data

US 2007/0131928 A1 Jun. 14, 2007

(30) Foreign Application Priority Data

Dec. 13, 2005 (KR) .................. 10-2005-0122737

(51) Int. Cl.
*H01L 51/00* (2006.01)
(52) U.S. Cl. ............... 257/40; 257/88; 257/89; 257/E51.018
(58) Field of Classification Search ............ 257/40, 257/88, 89, 98, 99, E51.018, E51.021, E33.067, 257/E33.071, E33.072
See application file for complete search history.

(56) References Cited

U.S. PATENT DOCUMENTS

| | | | |
|---|---|---|---|
| 6,624,936 B2 * | 9/2003 | Kotchick et al. | 359/490 |
| 6,841,803 B2 * | 1/2005 | Aizawa et al. | 257/98 |
| 2003/0025118 A1 * | 2/2003 | Yamazaki et al. | 257/79 |
| 2005/0035361 A1 * | 2/2005 | Peterson et al. | 257/98 |
| 2006/0291238 A1 * | 12/2006 | Epstein et al. | 362/600 |

FOREIGN PATENT DOCUMENTS

| | | |
|---|---|---|
| KR | 2002-0029809 | 4/2002 |
| KR | 2002-0030465 | 4/2002 |
| KR | 2002-0061474 | 7/2002 |
| KR | 10-2004-0067483 | 7/2004 |
| KR | 10-2004-0074939 | 8/2004 |

(Continued)

OTHER PUBLICATIONS

Korean Patent Abstracts for Publication No. 1020020029809 A; Date of Publication of Application Apr. 20, 2002 in the name of Cho.

(Continued)

*Primary Examiner*—Zandra Smith
*Assistant Examiner*—Paul E Patton
(74) *Attorney, Agent, or Firm*—Christie, Parker & Hale, LLP

(57) ABSTRACT

An organic light-emitting display device includes: a light-emitting element located between a first substrate and a second substrate, and adapted to emit light; a phase difference plate disposed on the first substrate or the second substrate in a path through which the light emitted from the light-emitting element is propagated, the phase difference plate being adapted to change a phase of an incident light; a wire grid polarizer disposed on the phase difference plate, and adapted to reflect a light having a specific polarization direction and to transmit a light having a polarization direction opposite to the specific polarization direction; and a dye-based polarizer disposed on the wire grid polarizer, and adapted to transmit the light having the polarization direction opposite to the specific polarization direction and to absorb the light having the specific polarization direction.

18 Claims, 5 Drawing Sheets

FOREIGN PATENT DOCUMENTS

| KR | 10-2005-0017871 | 2/2005 |
|----|-----------------|--------|
| KR | 10-2005-0018401 | 2/2005 |

OTHER PUBLICATIONS

Korean Patent Abstracts for Publication No. 1020020030465 A; Date of Publication of Application Apr. 25, 2002 in the name of Kim et al.

Korean Patent Abstracts for Publication No. 1020040067483 A; Date of Publication of Application Jul. 30, 2004 in the name of Cho et al.

Korean Patent Abstracts for Publication No. 1020040074939 A; Date of Publication of Application Aug. 26, 2004 in the name of Narutoshi.

Korean Patent Abstracts for Publication No. 1020050018401 A; Date of Publication of Application Feb. 23, 2005 in the name of Kim et al.

Korean Patent Abstracts for Publication No. 1020050017871 A; Date of Publication of Application Feb. 23, 2005 in the name of Ahn et al.

Korean Patent Abstracts, Publication No. 1020020061474 A, dated Jul. 24, 2002, in the name of Masaya Adachi et al.

\* cited by examiner

ORGANIC LIGHT-EMITTING DISPLAY DEVICE

CROSS-REFERENCE TO RELATED APPLICATIONS

This application claims priority to and the benefit of Korean Patent Application No. 10-2005-0122737, filed on Dec. 13, 2005, in the Korean Intellectual Property Office, the entire content of which is incorporated herein by reference.

BACKGROUND

1. Field of the Invention

The present invention relates to an organic light-emitting display device, and more particularly to an organic light-emitting display device including a dye-based polarizer capable of maintaining a polarization degree even at high temperatures.

2. Discussion of Related Art

An organic light-emitting display device, which is a next generation display device having self light-emitting characteristic, has better characteristics than a liquid crystal display device (LCD) in terms of viewing angle, contrast, response speed and power consumption, and can be manufactured to be thin and lightweight since a backlight is not required.

The organic light-emitting display devices can be categorized as a passive matrix type in which pixels are arranged in a matrix format at locations where scan lines and signal lines cross each other, and an active matrix type in which each pixel is controlled by a thin film transistor (TFT) that operates as a switch.

In the passive matrix-type organic light emitting display device, scan lines are sequentially driven over a period of time to drive each pixel, but in the active matrix-type organic light emitting display device, each pixel is driven by using a storage capacitor. This way, the active matrix-type organic light emitting display device is capable of obtaining the same brightness with low current so that it has advantages in terms of less power consumption, high definition and large-size over the passive matrix-type.

FIG. 1 is a schematic cross sectional view of one example of a conventional passive matrix-type organic light-emitting display device.

Anode electrodes 11 are formed on an insulating substrate 10, and a thin organic layer 20 is formed on the anode electrodes 11. The thin organic layer 20 is formed to have a structure in which a hole transport layer 21, an organic light-emitting layer 22 and an electron transport layer 23 are stacked, and can further include a hole injection layer and an electron injection layer. Also, on top of the thin organic layer 20, cathode electrodes 30 are formed to cross with the anode electrodes 11. The above described organic light emitting display device is encapsulated by a sealing substrate 40.

FIG. 2 is a schematic cross sectional view of one example of a conventional active matrix-type organic light-emitting display device.

A thin transistor T including a semiconductor layer 51, a gate electrode 52, and source and drain electrodes 53, 54, is formed on an insulating substrate 50. The source electrode 53 of the thin transistor T is connected to a storage capacitor $C_{ST}$ having a structure in which an electrode 55, a dielectric 56 and an electrode 57 are stacked. The drain electrode 54 is connected to a light-emitting element E having a structure in which an anode electrode 58, an organic layer 59 and a cathode electrode 60 are stacked. The above described organic light emitting display device is encapsulated by a sealing substrate 70.

In the organic light-emitting display device constituted as above, when a predetermined voltage is applied to the anode electrode and the cathode electrode, holes injected through the anode electrode and electrons injected through the cathode electrode are recombined at the light-emitting layer, thereby emitting light using a difference in energy generated during the process.

An organic light-emitting display device can be categorized as a bottom-emitting type wherein the emitted light is propagated towards the lower surface, or a top-emitting type wherein the emitted light is propagated towards the upper surface.

In the bottom-emitting-type device, since the emitted light is emitted towards a substrate on which the thin film transistor is formed, a wiring portion including the thin film transistor is excluded from a display area, while in the top-emitting-type device, the emitted light can be emitted towards the upper surface over the thin film transistor, thereby obtaining a wider display area.

A contrast ratio in the organic light-emitting display device, which is a brightness ratio at the time of on/off, represents a degree to which an image can be clearly recognized. The brightness at the time of off is determined by reflectivity to an incident light from an external light source. Therefore, in order to raise the contrast ratio, reflection of light from the external light source should be reduced.

In order to reduce the reflection of light from the external light source, a use of a $\lambda/4$ phase difference plate or a polarizing plate on the plate surface in the path through which the emitted light is propagated (See Korean Patent Application No. 2000-60524 (Oct. 14, 2000)) or a use of a circularly polarizing plate capable of controlling the phase difference, has been proposed.

In the case of using a polarizing plate that allows a light having a specific polarization direction (for example, only a horizontal wave) to pass through, the horizontal wave passing through the polarizing plate, is extinguished because it does not pass through the polarizing plate again, since the horizontal wave is reflected by an internal metal electrode and its phase is then changed using the $\lambda/4$ phase difference plate. Therefore, the phase difference is induced using the $\lambda/4$ phase difference plate and thus, the incident external light cannot be emitted, resulting in a reduction of reflection of the external light.

However, the organic light-emitting display device constituted as above has a disadvantage in that since even the light emitted internally from the organic light-emitting display device is interrupted by the polarizing plate to approximately 50%, its brightness is reduced by at least one-half. Also, the conventional polarizing plate is constituted of an iodine-based polarizing plate and thus, has poor durability against heat and humidity. Hence, it is difficult to apply such polarizing plate in display devices (e.g., television, etc.) to be used in environments that are exposed to heat (e.g., solar radiation) or humidity.

SUMMARY OF THE INVENTION

Accordingly, it is an aspect of the present invention to provide an organic light-emitting display device capable of maintaining an optimal or good contrast ratio even at a high temperature.

It is another aspect of the present invention to provide an organic light-emitting display device capable of reducing or minimizing the reflection of the external light and increasing the emission amount of light emitted internally from the organic light-emitting display device.

In order to accomplish the above features, an organic light-emitting display device according to one aspect of the present invention, includes: a first substrate and a second substrate; a light-emitting element located between the first substrate and the second substrate; a phase difference plate disposed on the first substrate or the second substrate in a path through which the light emitted from the light-emitting element is propagated; a wire grid polarizer disposed on the phase difference plate, and adapted to reflect the light having a specific polarization direction and to transmit the light having a polarization direction opposite to the specific polarization direction; and a dye-based polarizer disposed on the wire grid polarizer, and adapted to transmit the light having the polarization direction opposite to the specific polarization direction and to absorb the light having the specific polarization direction.

Also, in order to accomplish the above features, an organic light-emitting display device according to another aspect of the present invention, includes: a substrate; a light-emitting element located on the substrate; a passivation layer located on the light-emitting element; a phase difference plate located on the passivation layer; a wire grid polarizer disposed on the phase difference plate, and adapted to reflect a light having a specific polarization direction and to transmit a light having a polarization direction opposite to the specific polarization direction; and a dye-based polarizer disposed on the wire grid polarizer, and adapted to transmit the light having the polarization direction opposite to the specific polarization direction and to absorb the light having the specific polarization direction.

The phase difference plate may be adapted to change the phase of the incident light by 45°. Also, an anti-reflection layer may be formed on the dye-based polarizer, and the anti-reflection layer may be made of an anti-glare film or an anti-reflection film.

An organic light-emitting display device according to another aspect of the present invention, includes: a substrate having a first side and a second side opposite the first side; a light-emitting element located on the first side of the substrate; a phase difference plate disposed on the second side of the substrate; a first polarizer disposed on the phase difference plate, and adapted to reflect a light having a first polarization direction and to transmit a light having a second polarization direction opposite to the first polarization direction; and a second polarizer disposed on the first polarizer, and adapted to transmit the light having the polarization direction opposite to the first polarization direction and to absorb the light having the first polarization direction.

BRIEF DESCRIPTION OF THE DRAWINGS

These and/or other features and aspects of the invention will become apparent and more readily appreciated from the following description of the exemplary embodiments, taken in conjunction with the accompanying drawings of which.

DETAILED DESCRIPTION

In the following detailed description, certain exemplary embodiments of the present invention are shown and described, by way of illustration. As those skilled in the art would recognize, the described embodiments may be modified in various ways, all without departing from the spirit or scope of the present invention. Accordingly, the drawings and description are to be regarded as illustrative in nature, rather than restrictive.

Although an iodine-based polarizer has an excellent polarization degree, it is disadvantageous in that durability is deteriorated in an atmosphere of high temperature or high humidity. On the other hand, although a dye-based polarizer has a polarization degree lower than that of the iodine-based polarizer, it has a good thermal characteristic.

In general, since a dye-based polarizer has a low polarization degree, it has been difficult to use it as an element of a display device. However, as display devices have become large-sized and complex, in order to obtain a predetermined level of polarization degree even at high temperatures (e.g., in cases where the display device is to be exposed to a strong light or to be irradiated with a strong light from other light sources), the dye-based polarizer can be used.

In an embodiment in accordance with the present invention, an organic light-emitting display device capable of maintaining an optimal or good contrast ratio even at high temperatures, is provided by using a dye-based polarizer having a good thermal characteristic together with a wire grid polarizer.

FIGS. 3A, 3B, 4 and 5 are partial schematic cross sectional views of organic light-emitting display devices according to embodiments of the present invention.

Figure 1:
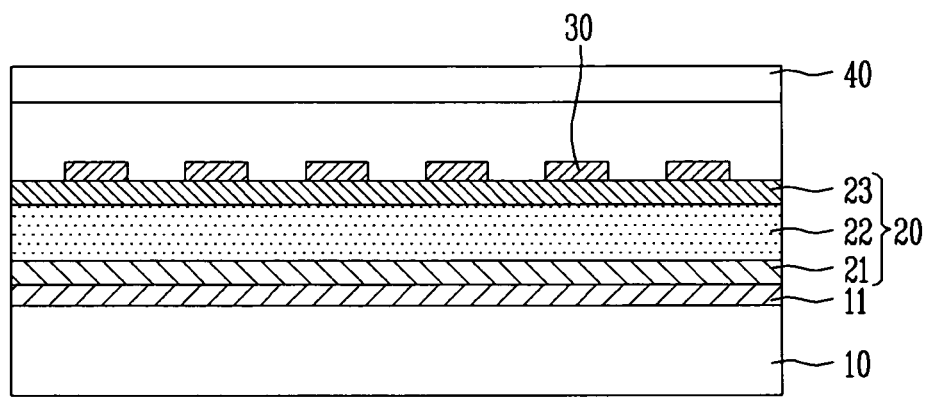
FIG. 1 is a schematic cross sectional view of one example of a conventional passive matrix-type organic light-emitting display device.
Figure 2:
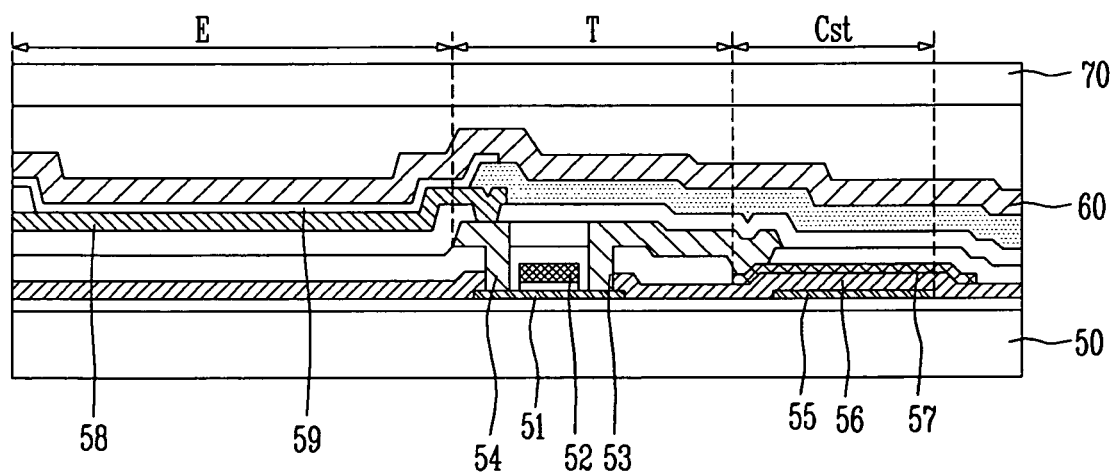
FIG. 2 is a schematic cross sectional view of one example of a conventional active matrix-type organic light-emitting display device.
Figure 3A:
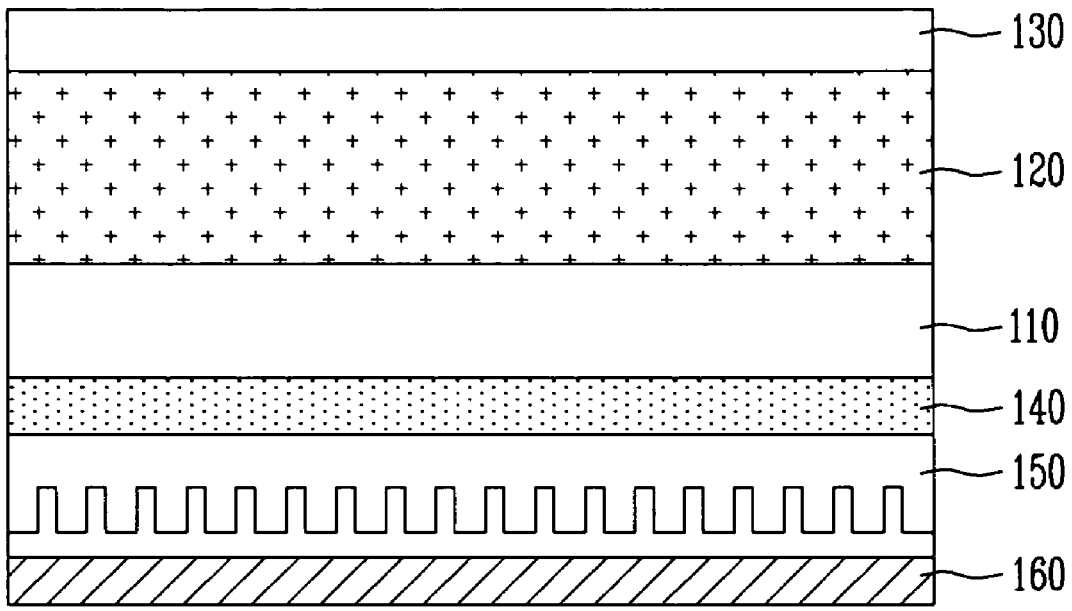
FIG. 3A is a partial schematic cross sectional view of an organic light-emitting display device according to a first embodiment of the present invention.

Referring to FIG. 3A, a light-emitting element 120 for emitting a predetermined light is formed on a substrate 110 made of a transparent material such as glass. The substrate 110 may be an insulating substrate. The organic light emitting display device is encapsulated by a sealing substrate 130. The sealing substrate 130 may be made of transparent material or any other suitable material.

Also, on the substrate 110 in a path through which the light emitted from the light-emitting element 120 is propagated, a phase difference plate 140 for changing the phase of the incident light by an angle, which may be predetermined, is disposed. A wire grid polarizer 150 for reflecting a light having a specific polarization direction and transmitting a light having a polarization direction opposite to the specific polarization direction, is disposed on the phase difference substrate 140.

On the wire grid polarizer 150, a dye-based polarizer 160 for transmitting the light having the polarization direction opposite to the specific polarization direction and absorbing the light having the specific polarization direction, is disposed. In one embodiment, on the surface of the dye-based polarizer 160, an anti-reflection layer 190 such as an anti-glare film or an anti-reflection film, etc., for reducing or minimizing the reflection of external light such as ultraviolet rays and/or the like, is formed.

The light-emitting element 120 can be constituted in a passive matrix scheme including a lower electrode, an organic layer and an upper electrode, or in an active matrix scheme including a lower electrode, an organic layer and an upper electrode and being controlled by a thin film transistor (TFT). The TFT operates in each pixel as a switch. The lower electrode, which is an anode electrode, is made of a transparent material such as ITO, IZO, ITZO, or any other suitable material, and the organic layer may include a hole transport layer, an organic light-emitting layer and an electron transport layer. The organic layer can further include a hole injection layer formed on the hole transport layer and an electron injection layer formed on the electron transport layer. In one embodiment, the upper electrode, which is a cathode electrode, is made of metal with low work function such as Ca, Mg, Al, Ag, any combination thereof, or any other suitable material.

In one embodiment, the phase difference plate 140 is, for example, a λ/4 phase difference plate capable of changing the phase of the incident light by 45°

The wire grid polarizer 150, which is a structure having a lattice with minute periods, reflects parallel components and transmits perpendicular components when the period of the lattice is shorter than the wavelength of the incident light.

The material for composing the dye-based polarizer 160 and the method of manufacturing such material are described in references including Korean Patent Laid-Open Publication Nos. 2002-30465 and 2004-74939. For example, such material used in one embodiment is manufactured by combining a pigment containing one type of specific metal and at least two types of pigments selected among specific pigments described in a color index. The dye-based polarizer manufactured as above is constituted or adapted to absorb light having a specific polarization direction and transmit light having a polarization direction opposite to the specific polarization direction, such as a conventional absorbing polarizer.

As a first embodiment of the present invention, when the light-emitting element 120 is implemented according to a bottom-emitting scheme, the phase difference plate 140, the wire grid polarizer 150 and the dye-based polarizer 160 are disposed below the substrate 110, as illustrated in FIG. 3A.

Figure 3B:
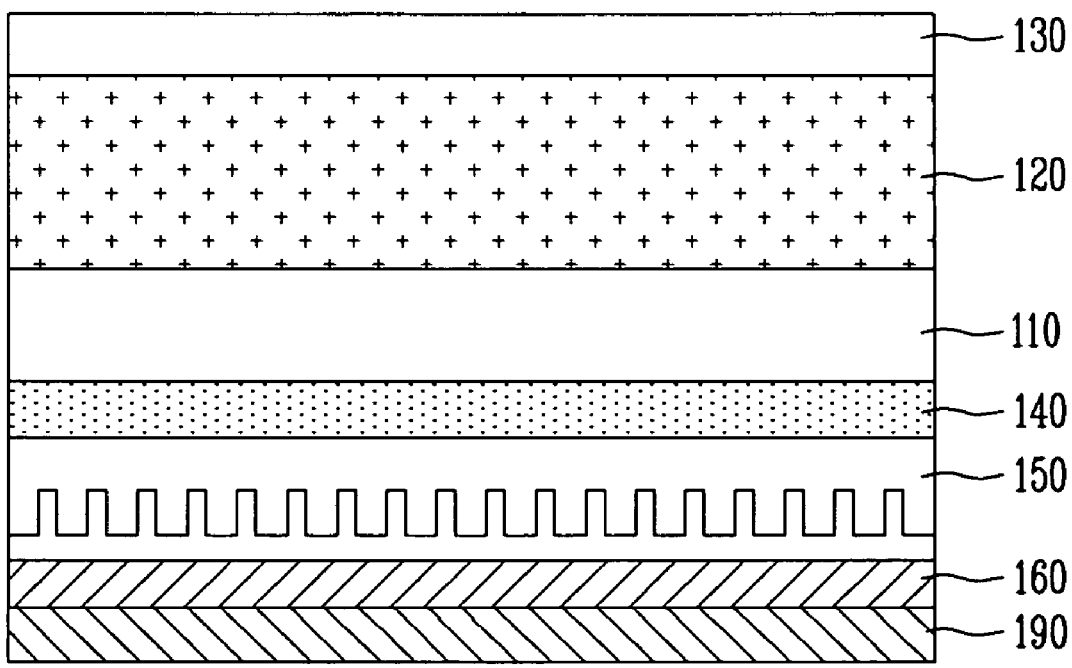
FIG. 3B is a partial schematic cross sectional view of an organic light-emitting display device according to a second embodiment of the present invention.

An organic light-emitting display device in accordance with a second embodiment of the present invention, includes an anti-reflection layer 190 formed or located on the dye-based polarizer 160, as illustrated in FIG. 3B. In other aspects, the organic light-emitting display device of FIG. 3B is substantially the same as the organic light-emitting display device illustrated in FIG. 3A. In one embodiment, the anti-reflection layer is made of an anti-glare film or an anti-reflection film.

Figure 4:
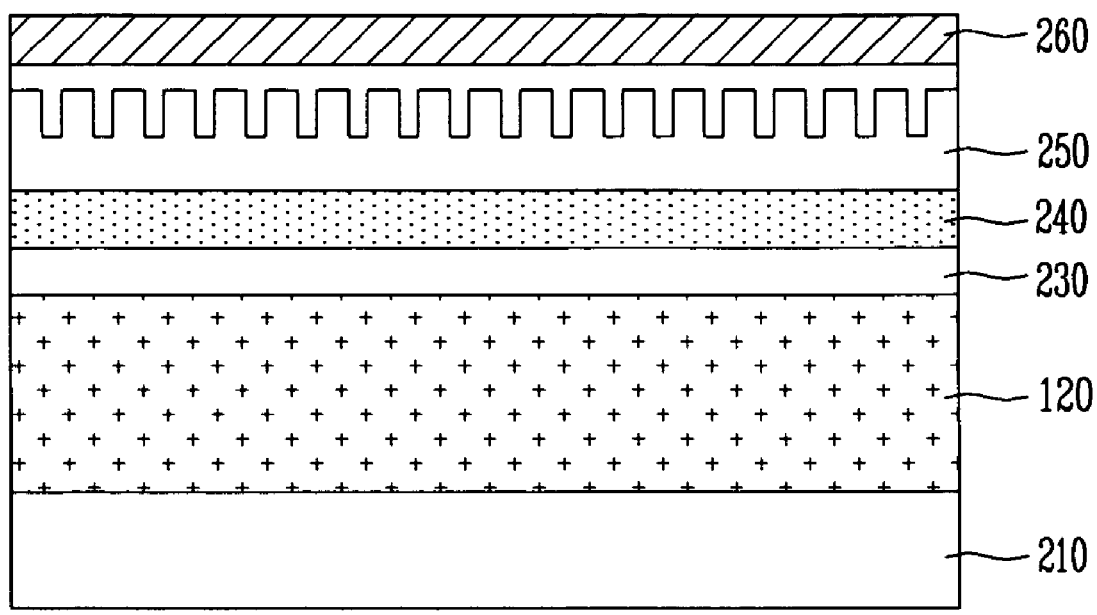
FIG. 4 is a partial schematic cross sectional view of an organic light-emitting display device according to a third embodiment of the present invention.

As a third embodiment of the present invention, when the light-emitting element 120 is implemented on a substrate 210 in accordance with a top-emitting scheme, a phase difference plate 240 is disposed on a sealing substrate 230 disposed on the light-emitting element 120, and a wire grid polarizer 250 and a dye-based polarizer 260 are disposed on the phase difference plate 240, as illustrated in FIG. 4. The substrate 210 may be an insulating substrate. In one embodiment, an anti-reflection layer may be disposed on the dye-based polarizer 260. The phase difference plate 240, the wire grid polarizer 250 and the dye-based polarizer 260 are substantially the same as the corresponding elements, namely, the phase difference plate 140, the wire grid polarizer 150 and the dye-based polarizer 160, respectively, of FIG. 3A.

Figure 5:
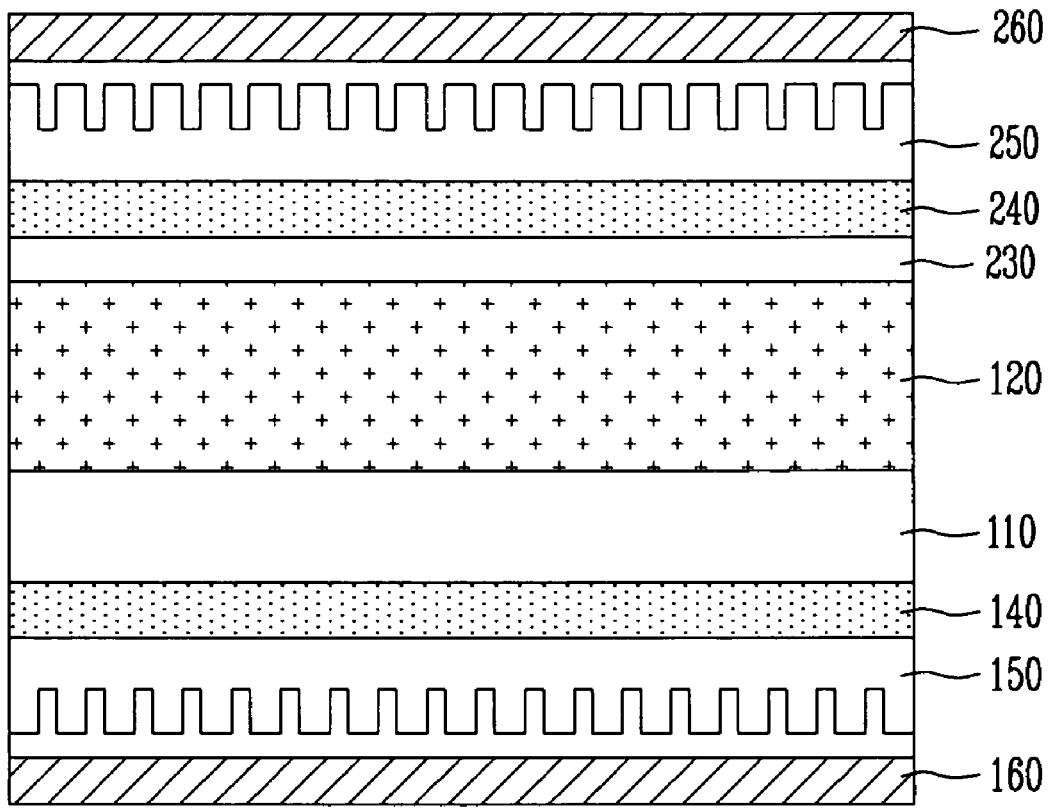
FIG. 5 is a partial schematic cross sectional view of an organic light-emitting display device according to a fourth embodiment of the present invention.

As a fourth embodiment of the present invention, when the light-emitting element 120 is used in a double-sided light-emitting scheme, the phase difference plate 140, the wire grid polarizer 150 and the dye-based polarizer 160 are disposed below the substrate 110, as illustrated in FIG. 5 similar to the embodiment of FIG. 3A. An anti-reflection layer may be disposed or formed on the dye-based polarizer 160.

As illustrated further in FIG. 5, the phase difference plate 240, the wire grid polarizer 250, and the dye-based polarizer 260 are disposed on the sealing substrate 230 similar to the embodiment of FIG. 4. An anti-reflection layer may be disposed or formed on the dye-based polarizer 260.

Figure 6:
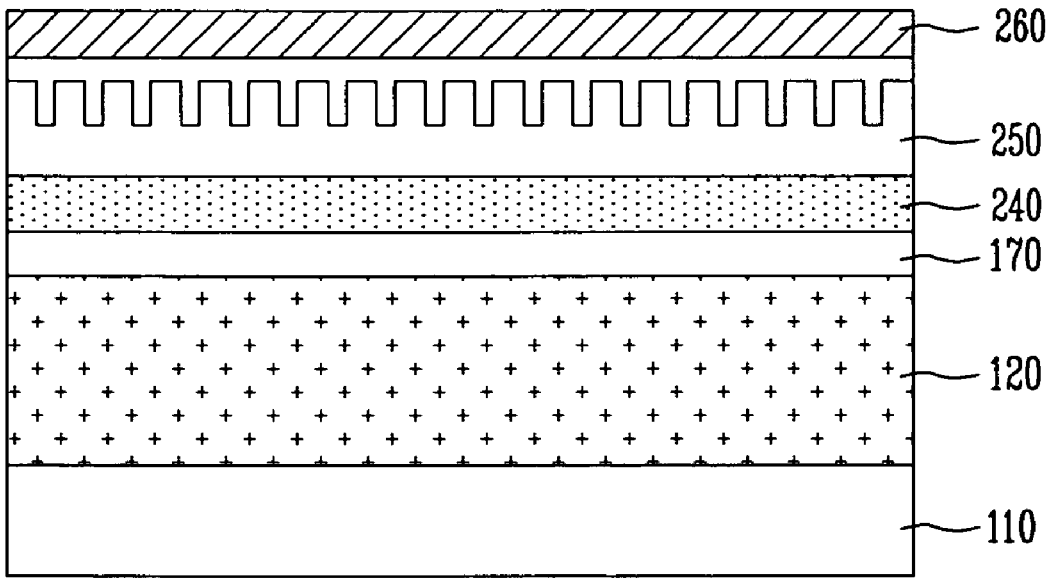
FIG. 6 is a partial schematic cross sectional view of an organic light-emitting display device according to a fifth embodiment of the present invention.

FIG. 6 is a partial schematic cross sectional view of an organic light-emitting display device according to a fifth embodiment of the present invention. Although it is structurally similar to the organic light-emitting display device illustrated in FIG. 4, a passivation layer 170 made of at least one of AlxOy, SiOxNy, SixNy, MgO, Tixoy, BxOy, VxOy, or AlTixOy, or any other suitable material, is formed on substantially the entire upper surface of the light-emitting element 120. Further, the phase difference plate 240, the wire grid polarizer 250 and the dye-based polarizer 260 are disposed on the passivation layer 170. In the embodiment of FIG. 6, a sealing substrate (e.g., the sealing substrate 230 in FIG. 4) is not formed or disposed on the light emitting element 120.

Figure 7:
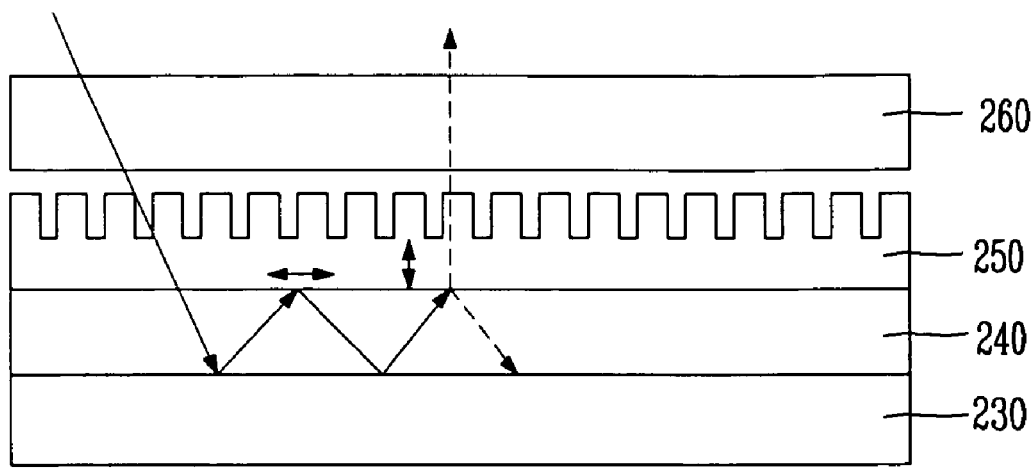
FIGS. 7 and 8 are partial schematic cross sectional views used for explaining the operations of an organic light-emitting display device according to embodiments of the present invention.
Figure 8:
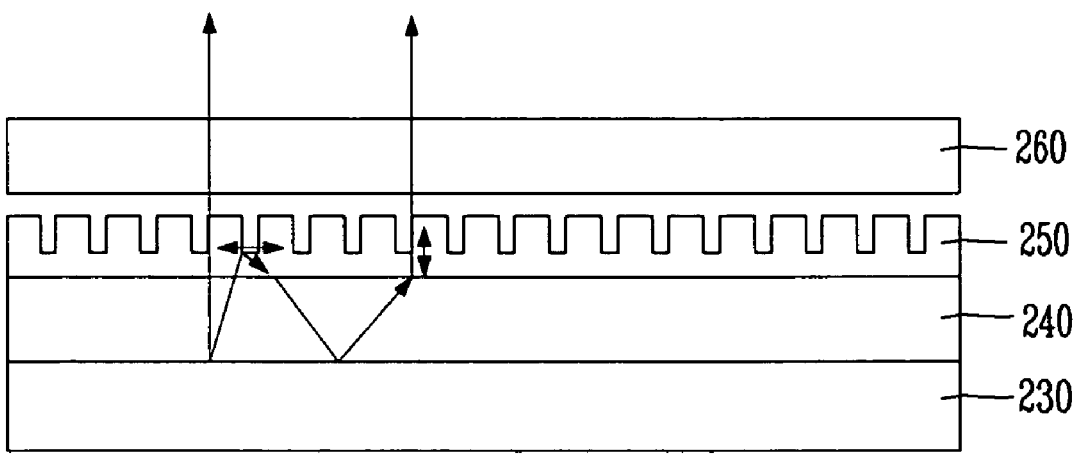

FIGS. 7 and 8 are partial schematic cross sectional views illustrating an operation of the organic light-emitting display device according to above-described embodiments of the present invention. In particular, operation of an organic light-emitting display device using a top-emitting scheme, as illustrated in FIG. 4, will be described in reference to FIGS. 7 and 8.

In the case where suitable (e.g., predetermined) voltages are applied to the lower electrode, which is the anode electrode, and the upper electrode, which is the cathode electrode, the light-emitting element 120 recombines holes injected through the lower electrode with electrons injected through the upper electrode, thereby emitting light using a difference of energy generated during the process. While the light emitted from the light-emitting element 120 is emitted outward, the external light from the external light source is incident on the organic light-emitting display device.

When the external light from the external light source is incident through the dye-based polarizer 260, the dye-based polarizer 260, for example, transmits a vertical wave and absorbs a horizontal wave among the external light, as illustrated in FIG. 7. At this time, when an anti-reflection layer is disposed or formed on the surface of the dye-based polarizer 260, not much reflection of the external light is generated.

The vertical wave of the external light that passed through the dye-based polarizer 260, then passes through the wire grid polarizer 250 and the phase difference plate 240, and is then incident inward. During this process, the phase of the vertical wave is changed, for example, by 45°, by the phase difference plate 240. And, the phase of the vertical wave of the external light reflected from an internal metal electrode (e.g., in the light emitting element 120) is changed again by 45° by the phase difference plate 240 to be changed into a horizontal wave. The external light that changed into the horizontal wave is reflected by the wire grid polarizer 250 and the phase thereof is then changed again by 45° by the phase difference plate 240 to be changed into the vertical wave and emitted outward via the dye-based polarizer 260. However, light intensity emitted during the process becomes weak and a portion of light is again reflected by the wire grid polarizer 250, resulting in that most of the incident external light is extinguished and the reflection of the external light thus becomes reduced or minimized.

The vertical wave among the light emitted from the light-emitting element 120 is emitted outward through the phase difference plate 240, the wire grid polarizer 250 and the dye-based polarizer 260, and the horizontal wave is reflected by the wire grid polarizer 250 and then the phase thereof is changed by 45° by the phase difference plate 240, as illustrated in FIG. 8. The horizontal wave whose phase has been changed is reflected on the internal metal electrode and then the phase thereof is again changed by 45° by the phase difference plate 240 so as to be changed into the vertical wave. This vertical wave is then emitted outward via the dye-based polarizer 260. Therefore, after the horizontal wave that was initially not emitted outward is reflected by the wire grid polarizer 250, the phase thereof is changed by the phase difference plate 240 and is thus emitted through the dye-based polarizer 260. This way, the emission amount of the emitted light is increased over that of the prior art.

While the embodiments of the present invention have been described in reference to a dye-based polarizer that absorbs horizontal wave and transmits vertical wave, and a wire grid polarizer that reflects horizontal wave and transmits vertical wave, the dye-based polarizer and the wire grid polarizer in other embodiments may respectively absorb, transmit or reflect lights having different polarization directions. For example, in another embodiment, the dye-based polarizer may absorb vertical wave and transmit horizontal wave, and the wire grid polarizer may reflect vertical wave and transmit horizontal wave.

The exemplary embodiments of the present invention use a dye-based polarizer having excellent thermal characteristics in order to overcome the disadvantage of an iodine-based polarizer that a polarization degree is deteriorated at high temperatures. However, since the dye-based polarizer has a polarization degree lower than that of the iodine-based polarizer, exemplary embodiments according to the present invention use both a dye-based polarizer and a wire grid polarizer in order to overcome the disadvantage. Therefore, the polarization can be stably maintained even at high temperatures and an optimal or good contrast ratio can be maintained by minimizing or reducing the reflection of the external light and increasing the emission amount of the emitted light.

Although a few embodiments of the present invention have been shown and described, terms used in the description are for explaining embodiments of the present invention, and are not intended to limit the meaning and scope of the present invention defined in the appended claims. It would be appreciated by those skilled in the art that changes might be made in these embodiments without departing from the principles and spirit of the invention, the scope of which is defined in the claims and their equivalents.

What is claimed is:

1. An organic light-emitting display device comprising:
    a first substrate;
    a second substrate;
    a light-emitting element between the first substrate and the second substrate;
    a phase difference plate on the first substrate or the second substrate in a path through which the light emitted from the light-emitting element is propagated;
    a wire grid polarizer on the phase difference plate, and adapted to reflect a light having a specific polarization direction and to transmit a light having a polarization direction opposite to the specific polarization direction; and
    a dye-based polarizer on the wire grid polarizer, and adapted to transmit the light having the polarization direction opposite to the specific polarization direction and to absorb the light having the specific polarization direction,
    wherein the phase difference plate is between the light-emitting element and the wire grid polarizer.

2. The device according to claim 1, wherein the light-emitting element comprises a first electrode and a second electrode and an organic layer between the first electrode and the second electrode.

3. The device according to claim 2, wherein the organic layer comprises a hole transport layer, an organic light-emitting layer and an electron transport layer.

4. The device according to claim 1, wherein the phase difference plate is adapted to change the phase of the incident light by 45°.

5. The device according to claim 1, further comprising an anti-reflection layer on the dye-based polarizer.

6. The device according to claim 5, wherein the anti-reflection layer is made of an anti-glare film or an anti-reflection film.

7. An organic light-emitting display device comprising:
    a substrate;
    a light-emitting element on the substrate;
    a passivation layer on the light-emitting element;
    a phase difference plate on the passivation layer;
    a wire grid polarizer on the phase difference plate, and adapted to reflect a light having a specific polarization direction and to transmit a light having a polarization direction opposite to the specific polarization direction; and
    a dye-based polarizer on the wire grid polarizer, and adapted to transmit the light having the polarization direction opposite to the specific polarization direction and to absorb the light having the specific polarization direction,
    wherein the phase difference plate is between the light-emitting element and the wire grid polarizer.

8. The device according to claim 7, wherein the phase difference plate is adapted to change the phase of the incident light by 45°.

9. An organic light-emitting display device comprising:
    a substrate having a first side and a second side opposite to the first side;
    a light-emitting element on the first side of the substrate;
    a phase difference plate on the second side of the substrate;
    a first polarizer on the phase difference plate, and adapted to reflect a light having a first polarization direction and to transmit a light having a second polarization direction opposite to the first polarization direction; and
    a second polarizer on the first polarizer, and adapted to transmit the light having the second polarization direction opposite to the first polarization direction and to absorb the light having the first polarization direction,
    wherein the phase difference plate is between the light-emitting element and the first polarizer.

10. The organic light-emitting display device of claim 9, further comprising an anti-reflection layer on the second polarizer.

11. The organic light-emitting display device of claim 9, wherein the phase difference plate is adapted to change the phase of the incident light by 45°.

12. The organic light-emitting display device of claim 9, wherein the first polarizer comprises a wire grid polarizer, and
the second polarizer comprises a dye-based polarizer.

13. The organic light-emitting display device of claim 9, wherein the substrate is a transparent substrate.

14. The organic light-emitting display device of claim 9, wherein the substrate is a sealing substrate, and
the organic light-emitting display device further comprises a second substrate adjacent to the light emitting element on a side opposite to the sealing substrate.

15. An organic light-emitting display device comprising:
a substrate having a first side and a second side opposite to the first side;
a light-emitting element on the first side of the substrate;
a phase difference plate on the second side of the substrate;
a first polarizer on the phase difference plate, and adapted to reflect a light having a first polarization direction and to transmit a light having a second polarization direction opposite to the first polarization direction;
a second polarizer on the first polarizer, and adapted to transmit the light having the second polarization direction opposite to the first polarization direction and to absorb the light having the first polarization direction;
an anti-reflection layer on the second polarizer;
a second substrate having a first side and a second side, the first side being adjacent to the light-emitting element;
a second phase difference plate on the second side of the second substrate;
a third polarizer on the second phase difference plate, and adapted to reflect a light having the first polarization direction and to transmit a light having the second polarization direction opposite to the first polarization direction; and
a fourth polarizer on the third polarizer, and adapted to transmit the light having the second polarization direction opposite to the first polarization direction and to absorb the light having the first polarization direction.

16. The organic light emitting display device of claim 15, wherein the second phase difference plate is adapted to change the phase of the incident light by 45°.

17. The organic light emitting display device of claim 15, wherein the substrate and the second substrate are transparent substrates.

18. The organic light emitting display device of claim 15, wherein the first polarizer and the third polarizer are wire grid polarizers, and the second polarizer and the fourth polarizer are dye-based polarizers.

* * * * *

UNITED STATES PATENT AND TRADEMARK OFFICE
CERTIFICATE OF CORRECTION

| | |
|---|---|
| PATENT NO. | : 7,638,796 B2 |
| APPLICATION NO. | : 11/580797 |
| DATED | : December 29, 2009 |
| INVENTOR(S) | : Noh-Min Kwak et al. |

It is certified that error appears in the above-identified patent and that said Letters Patent is hereby corrected as shown below:

On the Title Page

Item (75) Inventors     Delete "Moh"

Insert -- Noh --

Signed and Sealed this
Twenty-eighth Day of August, 2012

David J. Kappos
*Director of the United States Patent and Trademark Office*